US008842026B2

(12) United States Patent
Levy (10) Patent No.: US 8,842,026 B2
(45) Date of Patent: Sep. 23, 2014

(54) SYMBOL DECODER, THRESHOLD ESTIMATION AND CORRELATION SYSTEMS AND METHODS

(71) Applicant: Infineon Technologies AG, Neubiberg (DE)

(72) Inventor: David Levy, Wernberg (AT)

(73) Assignee: Infineon Technologies AG, Neubiberg (DE)

( * ) Notice: Subject to any disclaimer, the term of this patent is extended or adjusted under 35 U.S.C. 154(b) by 7 days.

(21) Appl. No.: 13/705,907

(22) Filed: Dec. 5, 2012

(65) Prior Publication Data

US 2014/0152485 A1  Jun. 5, 2014

(51) Int. Cl.
*H03M 1/06* (2006.01)
*H03M 99/00* (2006.01)
*H03M 1/10* (2006.01)
*H03M 1/18* (2006.01)

(52) U.S. Cl.
CPC ............ *H03M 99/00* (2013.01); *H03M 1/1057* (2013.01); *H03M 1/182* (2013.01)
USPC ........... 341/118; 341/120; 341/139; 341/140; 341/155

(58) Field of Classification Search
CPC ....... H03M 1/12; H03M 1/10; H03M 1/0658; H03M 1/1062; H03M 1/1057
USPC .......................................... 341/118, 120, 155
See application file for complete search history.

(56) References Cited

U.S. PATENT DOCUMENTS

| 3,723,649 | A  * | 3/1973 | Pitegoff et al. ............... 358/406 |
| 6,212,457 | B1 | 4/2001 | Miciuda et al. |
| 6,278,750 | B1 * | 8/2001 | Yu ................................. 375/345 |
| 6,302,439 | B1 | 10/2001 | McCurdy |
| 6,421,388 | B1 * | 7/2002 | Parizhsky et al. ............. 375/243 |
| 6,784,820 | B1 * | 8/2004 | Casalegno et al. ............ 341/155 |
| 6,792,055 | B1 * | 9/2004 | Hart .............................. 375/345 |
| 6,980,140 | B1 * | 12/2005 | Rowland et al. .............. 341/118 |
| 7,420,708 | B2 * | 9/2008 | Mantell ........................ 358/3.03 |
| 7,477,177 | B2 * | 1/2009 | Kuramochi et al. .......... 341/156 |
| 7,657,354 | B2 | 2/2010 | Breed et al. |
| 8,587,464 | B2 * | 11/2013 | Bonaccio et al. ............. 341/155 |
| 2002/0172112 | A1 * | 11/2002 | Shoji et al. ................. 369/47.35 |
| 2009/0002527 | A1 * | 1/2009 | Higuchi ........................ 348/243 |
| 2009/0051576 | A1 * | 2/2009 | Dedic et al. .................. 341/136 |
| 2009/0091484 | A1 * | 4/2009 | Weng et al. ................... 341/143 |
| 2010/0197053 | A1 * | 8/2010 | Haroun et al. ................. 438/18 |
| 2010/0259298 | A1 * | 10/2010 | Huang et al. .................... 326/71 |
| 2011/0115660 | A1 * | 5/2011 | Singer et al. .................. 341/155 |
| 2011/0122009 | A1 * | 5/2011 | Cheng et al. .................. 341/143 |
| 2013/0229294 | A1 * | 9/2013 | Matsuno et al. .............. 341/155 |

OTHER PUBLICATIONS

FPSI5 Technical Specification. "Peripheral Sensor Interface for Automotive Applications" dated Aug. 10, 2012. 62 Pages.
DSI "DSI3 Bus Standard Revision 1.00" dated Feb. 16, 2011. 45 Pages.

* cited by examiner

*Primary Examiner* — Linh Nguyen
(74) *Attorney, Agent, or Firm* — Eschweiler & Associates, LLC (57) ABSTRACT

A threshold estimate system includes a level quantizer, a correlation mechanism, and a threshold adaptation component. The level quantizer is configured to receive an input signal and to generate a quantization signal from the input signal according to one or more threshold levels. The correlation mechanism is configured to correlate the quantization signal with reference symbols to generate an output signal. The threshold adaptation component is configured to modify the one or more threshold levels according to the output signal and the input signal.

21 Claims, 5 Drawing Sheets

| ENCODED DATA | SYMBOL | | |
|---|---|---|---|
| | CHIP 1 | CHIP 2 | CHIP 3 |
| 0 | 1 | 1 | 0 |
| 1 | 2 | 1 | 1 |
| 2 | 1 | 0 | 2 |
| 3 | 2 | 0 | 2 |
| 4 | 1 | 0 | 0 |
| 5 | 2 | 1 | 2 |
| 6 | 1 | 1 | 2 |
| 7 | 2 | 0 | 1 |
| 8 | 2 | 2 | 0 |
| 9 | 2 | 1 | 0 |
| 10 | 1 | 2 | 2 |
| 11 | 2 | 2 | 1 |
| 12 | 1 | 2 | 0 |
| 13 | 2 | 0 | 0 |
| 14 | 1 | 0 | 1 |
| 15 | 1 | 2 | 1 |

SYMBOL DECODER, THRESHOLD ESTIMATION AND CORRELATION SYSTEMS AND METHODS

BACKGROUND

Automotive systems are complex systems that include computers and components to operate and monitor operation automotive vehicles. The automotive systems monitor and control automotive functions, such as engine operation, fuel control, air bag operation, and the like.

The automotive system components include sensors, control systems, a central controller, and the like. The components are typically distributed throughout a vehicle and need to communicate with each other. For example, sensors send sensor measurements to the central controller, commands are sent to control systems, and the like. Various techniques can be utilized to facilitate inter component communication.

One approach is to utilize a distributed bus. Components are connected to the bus and can send and receive messages or commands to other components connected to the bus. The distributed bus permits communication between components in varied locations in a vehicle.

DETAILED DESCRIPTION

The present invention will now be described with reference to the attached drawing figures, wherein like reference numerals are used to refer to like elements throughout, and wherein the illustrated structures and devices are not necessarily drawn to scale.

The disclosure includes systems and methods for performing threshold estimate for distributed bus systems. The systems and methods include techniques for adapting threshold values and identifying quantization levels.

Distributed bus systems can be utilized in a variety of applications, including automotive systems. Such systems use a variety of components including, but not limited to, sensors, control systems, central controllers, and the like. The components interact via communications or messages. The components can operate as master and slaves and utilize current modulation. A master supplies slaves with a quiescent current. The slave modulates the current in a way that the master has to supply a higher current during data modulation. A receiver of the modulated current demodulates the input signal and obtains a bit stream.

Figure 1:
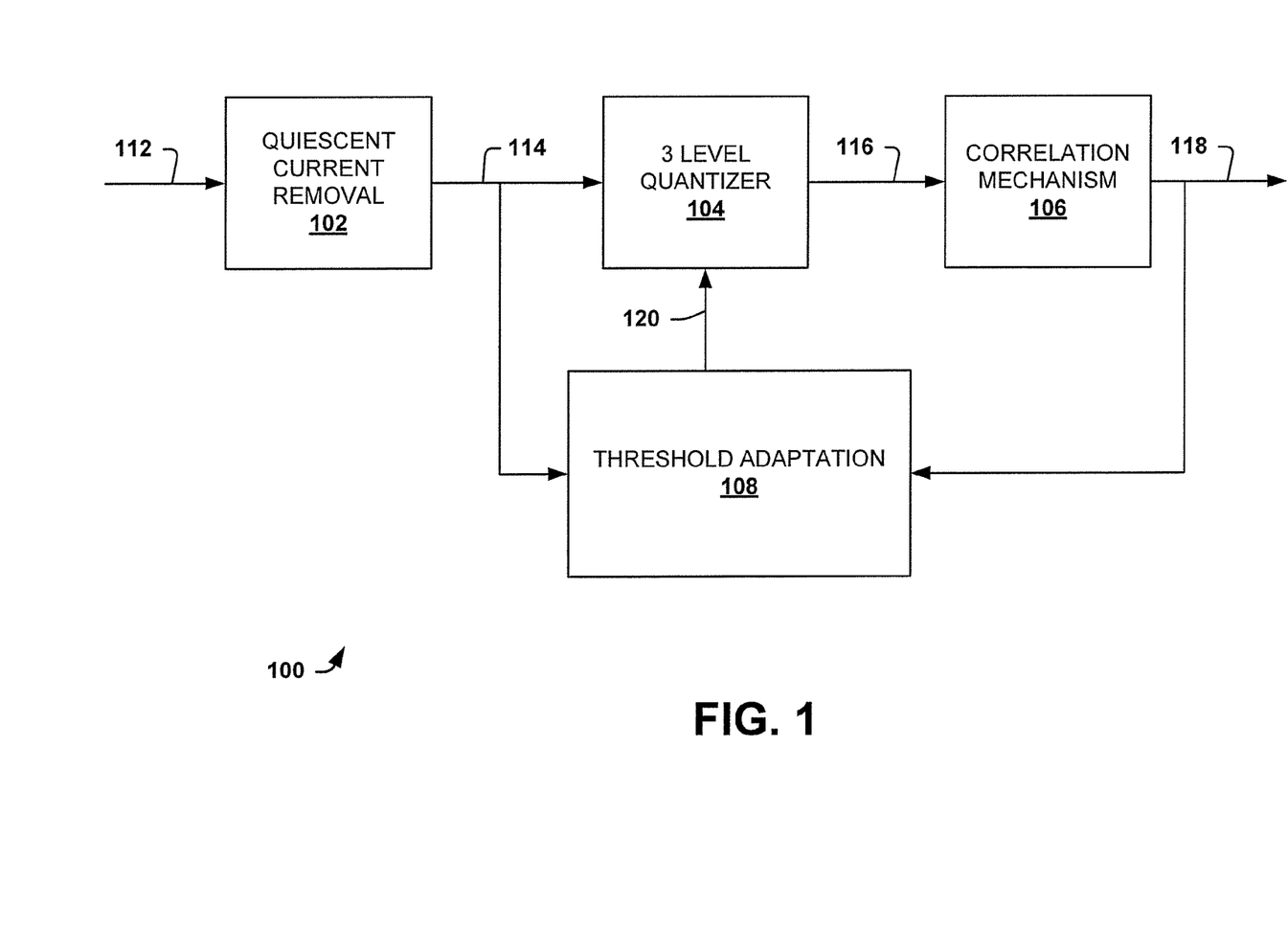
FIG. 1 is a block diagram illustrating a system for obtaining data from an input signal using threshold adaptation.

FIG. 1 is a block diagram illustrating a system 100 for obtaining data from an input signal using threshold adaptation. The system 100 can be utilized for obtaining bit streams of data from current based massaging schemes, such as distributed bus systems. It is appreciated that the system 100 is provided for illustrative purposes and that variations are contemplated.

The system 100 shows how modulated current from a component can be received and processed to obtain a bit stream of information. The system 100 uses quantization techniques and correlation to derive the bit stream as shown below. A multi level current modulation scheme is utilized, which in one example is used to generate symbols having up to 4 bits of data content each. The system 100 can be utilized for bus systems including, but not limited to the distributed system interface (DSI and DSI3) standards, the peripheral sensor interface (PSI or PSI5) standards, and the like. It is appreciated that other codings and symbols can be utilized in variations of the system.

The system 100 includes a quiescent current removal component 102, a quantizer 104, a correlation mechanism 106, and a threshold adaptation component 108. The quiescent component 102 receives an input signal 112 in the form of a modulated input current. The input signal 112 has a current value ranging from 0 to a max value that varies with time in order provide information. The quiescent component 102 removes at least a portion of quiescent current present in the input signal 112 and generates a differential signal 114 having the quiescent current at least partially removed. In one example, the quiescent component 102 estimates DC current when no modulation takes place and then removes the estimated DC current as the quiescent current from the input signal 112.

The quantizer 104 receives the differential signal 114 from the quiescent component 102. The quantizer 104 is multi level quantizer and quantizes the differential signal into one of a plurality of levels, such as level 0, level 1, and level 2. The quantizer 104 compares the differential signal 114 with the threshold levels 120 and provides quantized samples as quantized signal 116. The threshold levels 120 are estimated and continuously adapted. In one example, there are 3 levels for 16 possible symbols of 3 chips each, which are used according to the distributed system interface (DSI) standard. In another example, according to a peripheral sensor interface (PSI) standard, there are two possible levels for 2 possible symbols of 2 chips each. It is appreciated that the quantizer 104 can be configured to quantize to a suitable number of levels.

In one example, a Level 1 is a threshold value for signal current at about a first value, referred to here as a response frame level ($I_{RESP}$). Level 2 is a threshold value for signal current at about a second value, which is about twice that of level 1. For level 2, the second value is also referred to in terms of the response frame as $2*I_{RESP}$. In this example, if signal 114 is less than level 1, signal 116 is quantized to 0. If signal 114 is >than level 2, signal 116 is quantized to a value of 2. Otherwise, the signal 116 is quantized to a value of 1.

The correlation mechanism 106 obtains the quantized signal 116 from the quantizer 104. The correlation mechanism 106 uses the quantized samples in the signal 116 to recognize or identify expected patterns and generate a bit stream 118. Further details of the operation of the correlation mechanism 106 are provided below.

The threshold adaptation component 108 estimates and adapts the quantization levels 120 used by the quantizer 104. Thus, previously used threshold values are analyzed and updated using the differential signal 114 and the output bitstream 118. The differential signal 114 and the output bitstream 118 are utilized to identify erroroneous chip codings and are utilized to adapt, perhaps iteratively, the threshold level values 120. The updated levels 120 are provided to the quantizer 104 to facilitate quantization. Additional details on operation of the threshold adaptation component 108 are provided below.

Figure 2:
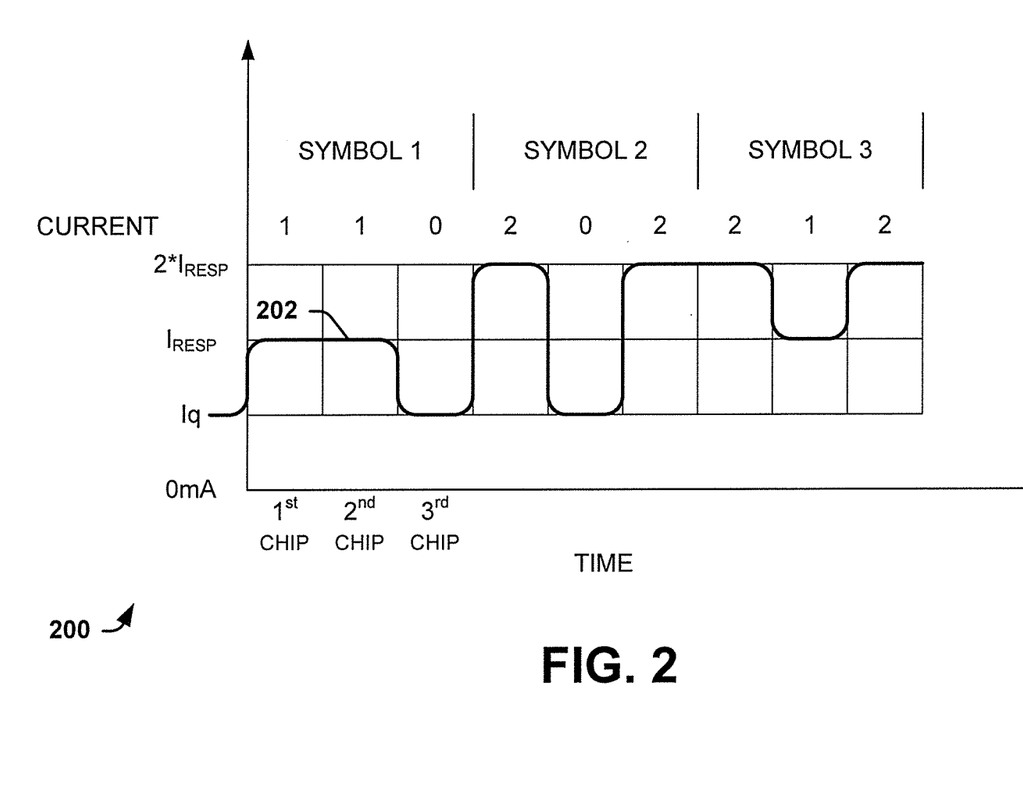
FIG. 2 is a graph illustrating an encoding example for current modulation.

FIG. 2 is a graph illustrating an encoding example for current modulation. The example illustrates a signal 202 that provides information using a specific modulation technique, including varied current values. The signal 202 can be utilized for response frames, such as from a slave to a master in a distributed bus system.

The graph 200 depicts time along an x-axis and current of the modulated current signal on a y-axis. The graph 200 is provided as an example to facilitate understanding.

As stated above, the modulated current is generated using a quiescent current and three current modulation levels, level 0, level 1, and level 2. The modulation levels correspond to the threshold levels described above. Level 0 is a modulation level at modulation current of about zero plus the quiescent current. Level 1 is a modulation level at a modulation current at about a first value above the quiescent current, referred to here as a response frame level ($I_{RESP}$). Level 2 is a modulation level at a modulation current at about a second value, which is about twice that of level 1 above the quiescent current. For level 2, the second value is also referred to in terms of the response frame as $2*I_{RESP}$.

The modulation levels correlate to data values as shown. Modulation current at level 0 corresponds to a data value of 0, current at level 1 corresponds to a data value of 1, current at level 2 corresponds to a data value of 2. A symbol includes 4 bits of data using the 3 chips per symbol.

The smallest amount or chunk of information conveyed is referred to as a chip, which represents one of the current modulation levels. A minimum duration during which the sender (slave) maintains the signal at the same modulation level during data transmission is $t_{chip}$. Three individual, consecutive chips form a symbol. For example, FIG. 2 shows that $1^{st}$, $2^{nd}$, and $3^{rd}$ chips comprise symbol 1. It can also be seen that the data conveyed by symbol 1 is "1 1 0". The data conveyed by symbol 2 is "2 0 2". Additionally, the data conveyed by symbol 3 is "2 1 2".

Figure 3:
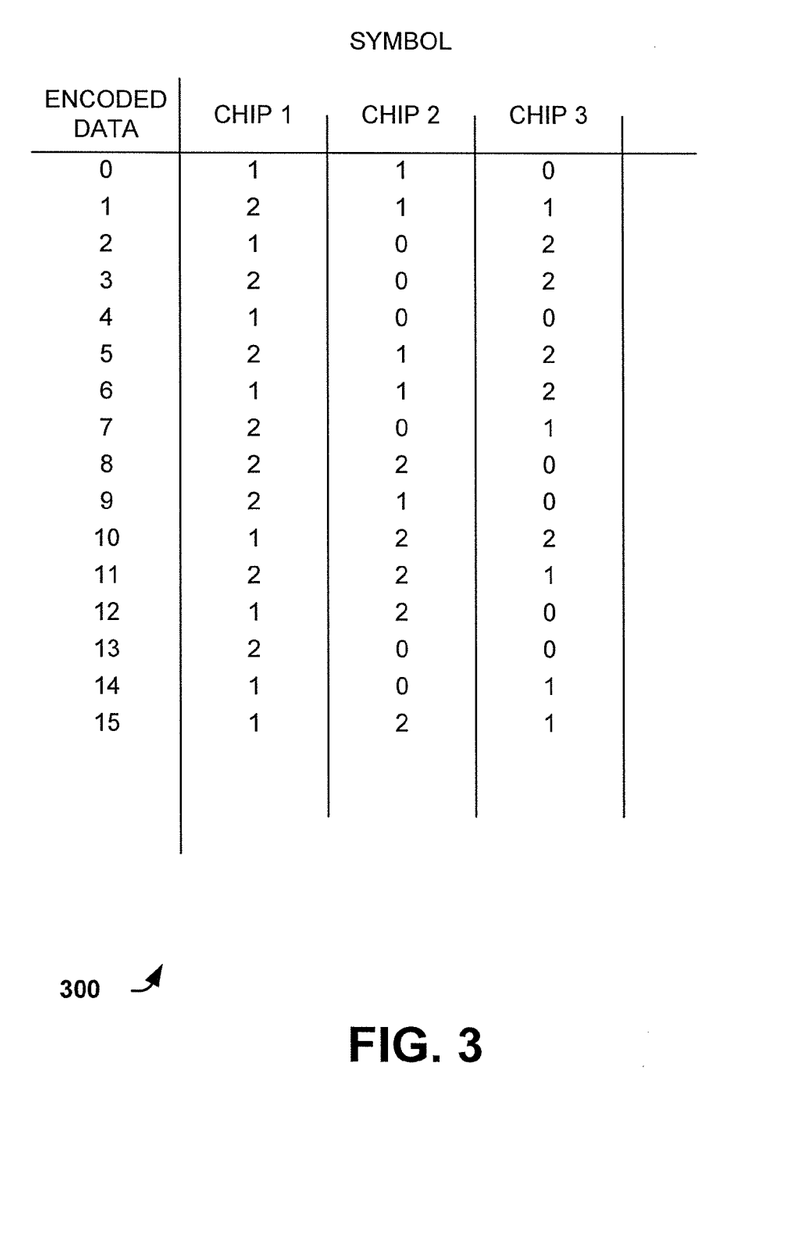
FIG. 3 is a coding table for symbols.

FIG. 3 is a coding table 300 for symbols. The table 300 provides example symbol codings for the system 100 of FIG. 1 and the example codings for modulation current in FIG. 2. It is appreciated that other suitable codings can be utilized for the system 100 of FIG. 1 and variations thereof.

There are 16 possible codings for a symbol in the table 300, which follows the 4 bits of data per symbol specified above. Each row correlates a symbol data value with a symbol coding. The symbol includes a first chip, second chip, and a third chip as shown.

Each symbol coding has a corresponding data value. For example, symbol 1 of FIG. 2, yields chip values of "1 1 0", which corresponds to a symbol data value of 0. Chip values of "2 0 2" corresponds to a symbol data value of 3. Chip values of "2 1 2" corresponds to a symbol data value of 5.

Referring back to FIG. 1, the threshold adaptation component 108 provides an initial estimate of the threshold values 120, which include level 0, level 1, and level 2. The initial estimates can be predetermined or provided by a suitable approach. Subsequently, the threshold adaptation component 108 adapts the threshold values according to a suitable technique or algorithm. One example is provide below.

The algorithm outputs a set of threshold level estimations for each symbol detected by the correlation mechanism. The beginning of the first symbol in a frame (or sequence) is the first time a differential signal having a current level 1 threshold is crossed. The beginning of the sequence is detected by the correlation mechanism 106 and provided with the data bit stream 118 and provided to the threshold adaptation component 108.

An average measured current for a duration of a symbol is given in (1), $$\mu_m = \frac{1}{n_s} \sum_{i=1}^{n_s} I_m[i] \quad (1)$$

Where is $\mu_m$ the number of current samples in the detected symbol and $I_m[i]$ is the measured differential current of sample i. $n_s$ may vary from symbol to symbol due to distortions, such as channel phase distortion or clock mismatch between component.

The average current varies according to the symbol, as shown in FIG. 3. Thus, the recognized symbol can be used to calculate an expected current. The average expected current $\mu_e$ is given in equation (2).

$$\mu_e = \frac{1}{3}(n_{c1} I_1[s-1] + n_{c2} I_2[s-1]) \quad (2)$$

Where $n_{c1}$ and $n_{c2}$ are the number of chips at level 1 and 2, respectively, for the recognized symbol. An error amount $\epsilon$ is determined to be the difference between the measured and expected current.

$$\epsilon = \mu_m - \mu_e \quad (3)$$

The error amount can separated into errors related to level 1 and level 2 as shown in (4).

$$\epsilon = \frac{1}{3}(n_{c1} \epsilon_1 + n_{c2} \epsilon_2) \quad (4)$$

Where $\epsilon_1$ is an error amount for level 1 and $\epsilon_2$ is an error amount for level 2. Assuming that there is no saturation effect on the currents, the following relationship is obtained in (5).

$$I_1[s] = \frac{I_2[s]}{2} \quad (5)$$

$$\epsilon_1 = \frac{\epsilon_2}{2} \quad (6)$$

Then, the relationship between an error for level 1 and an error for level 2 is shown in (6). Using above equations (2, (3), (4), (5), and 6, the error on differential current level 2 is obtained as a function of the measured average current and the previous current level as shown in (7).

$$\epsilon_2 = \frac{3\mu_m - \left(\frac{n_{c1}}{2} + n_{c2}\right) I_2[s-1]}{\frac{n_{c1}}{2} + n_{c2}} \quad (7)$$

A similar approach is used to obtain the error for level 1 and is shown in (8).

$$\epsilon_1 = \frac{3\mu_m - \left(\frac{n_{c1}}{2} + n_{c2}\right) I_1[s-1]}{\frac{n_{c1}}{2} + n_{c2}} \quad (8)$$

The errors can be used to update the threshold values 120. However, a first order infinite impulse response (IIR) can be utilized to mitigate overcorrection of the threshold level values 120. An alpha value, also referred to as a mitigation factor, is selected to mitigate the overcorrection as shown in the below equations (9) and (10). The alpha value can be made larger in order to increase the convergence time to the optimal or improved threshold value(s). The alpha value can be made smaller to avoid or mitigate large oscillations around the optimal or improved threshold value. The alpha value can range from 0 to 1. Some examples of suitable alpha values include 0.25, 0.125 and 0.0625. However, it is appreciate that alpha values can vary on implementation.

$$I_1[s]=I_1[s-1](1-\alpha)+\alpha(I_1[s-1]+\epsilon_1)=I_1[s-1]+\alpha\epsilon_1 \quad (9)$$

$$I_2[s]=I_2[s-1]+\alpha\epsilon_2 \quad (10)$$

The threshold values after the sample was received, $T_{01}[s]$ and $T_{12}[S]$ are the middle values between level 1 and level 2 as shown in (11) and (12).

$$T_{01}[s] = \frac{I_2[s]}{2} \quad (11)$$

$$T_{12}[s] = \frac{I_1[s] + I_2[s]}{2} \quad (12)$$

The updated threshold values 120 are provided to the quantizer 104. The updated values 120 are utilized for the next symbol and the process repeats.

The correlation mechanism 106 uses the quantization signal 116, which includes quantization samples, to recognize symbols and generate a data bit stream 118. The mechanism 106 calculates a correlation score and uses the correlation score to decode the samples into recognized symbols.

The last N quantized samples q[1], q[2], . . . q[N] are stored or maintained from the quantization signal, with q[N], being the oldest sample. The value of N is selected to be divisible by the number of chips per symbol, which is 3 for the case of DSI version 3 and 2 for PSI version 5. In one example, N is selected to be 27 leading to 9 samples per chip. Corresponding reference values are also selected according to FIG. 3. The reference values are noted as $r_j[i]$, with j being the reference number (encoded data) and i being the sample number. Thus, $r_2[0]=2$, which corresponds to FIG. 3 showing that the encoded data for 2 for the newest sample (last of chip 3) provides a chip value of 2.

Quantization samples taken adjacent to multiple chips (boundary crossings) are subject to inter-symbol interference. Their values tend to be non-ideal because the signals are transitioning between levels. As a result, their values are deemed to be unknown or unnecessary. Thus, inter-chip reference values are not compared. Inter-chip reference values are denoted by c[i], with i, the sample number. The inter-chip reference values are set to 0 at boundary crossings as shown in (21).

$$c[i] = \begin{cases} 0 & \text{if } i = 1, \frac{N}{3}, \frac{N}{3}+1, \frac{2N}{3}, \frac{2N}{3}+1, N \\ 1 & \text{other } i \text{ values} \end{cases} \quad (21)$$

A sample correlation score is defined by equation (22).

$$\sigma_j[i] = \begin{cases} -|q[i] - r_j[i]|0 & \text{if } q[i] \neq r_j[i] \\ 1 & \text{if } q[i] = r_j[i] \end{cases} \quad (22)$$

Equation (22) compares a sample to an expected reference value. If they are equal, the score is incremented. If they are different, the score is decreased. If the difference between the reference and the sample is 1, the score is decremented. If the difference between the reference and the sample is 2, the score is decreased by 2.

An overall correlation score for a symbol is merely the sum of sample correlation scores over all samples as shown by (23).

$$S_j = \Sigma_{i=1}^N c[i]\sigma_j[i] \quad (23)$$

The correlation mechanism 106 analyzes the correlation scores each time a new sample is received and decides which reference correlates with the last N samples. An exact symbol length may not be known and can vary due to inaccuracies such as sensor clock and receiver clock inaccuracies. One technique to identify the symbol length is to look for a peak in the overall correlation score. This can be done by comparing a previous correlation score for the previous sample, $S'_j$, with the current correlation score $S_j$ for all j. If two or more references reached a peak at the same time, the reference with the highest peak $S'_m$ is selected.

If the above technique does not provide the exact symbol length, the length still needs to have at least a minimum number of samples $N_{min}$. Thus, any peak prior to reaching the minimum number of samples $N_{min}$ is ignored. For a first symbol, a sample counter starts with a first crossing of one of the current thresholds. For subsequent symbols, the sample counter is reset each time a symbol is detected. Further, if the highest peak $S'_m$ has a lower score than a fixed threshold score $S_{th}$, then the peak is also ignored because there is a weak correlation between the reference and the symbol.

If the highest peak score reached on a reference m, $S'_m$ is not the maximum score when compared against all other references, the peak $S'_m$ is also ignored. This implies that some other reference has a higher correlation than reference m, but the peak correlation score for this other reference is not yet reached.

If the peak correlation score $S'_m$ was not ignored, the reference m is chosen as the pattern recognized for the last N samples. The reference m in one example, is one of the 16 possible symbol encodings shown in the table presented in FIG. 3. Once the symbol is identified, a new pattern recognition is initiated with new samples.

Figure 4:
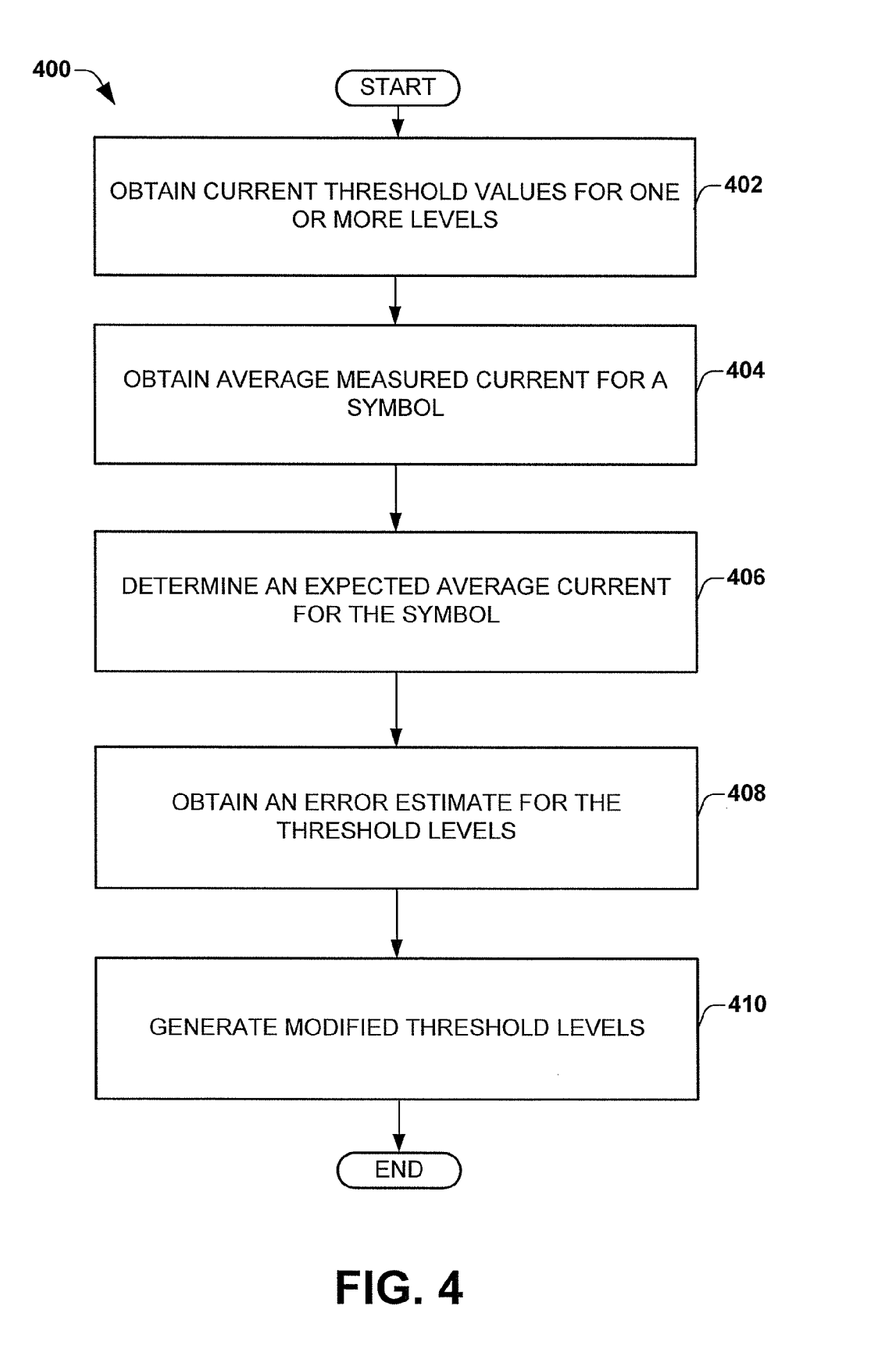
FIG. 4 is a flow diagram illustrating a method of updating threshold level values.

FIG. 4 is a flow diagram illustrating a method 400 of updating threshold level values. The method 400 can be used iteratively to adapt and improve threshold values used by a quantizer, such as the quantizer 104 described in FIG. 1. The method 400 uses a symbol and measured samples to generate an error estimate. The generated estimate is then utilized to update or adapt threshold level values, which facilitates operation of a bus system. It is appreciated that the method 400 and variations thereof can be utilized for operation of the threshold adaptation component 108.

The method 400 begins at block 402, wherein current threshold values are obtained. The current threshold values include a value for one or more levels used in modulating current for communication. In one example, the threshold values include 3 levels. The threshold values can be initial assigned values or obtained from a previous adaptation of a previous value.

An average measured current for a symbol is obtained at block 404. The average measured current is obtained by obtained a number of samples during a symbol period and calculated an average measured current from the samples.

An expected average current for the symbol is determined at block 406. The expected average current can vary from the average measured current due to distortions and the like. The expected average current is derived using expected levels for chips in the detected symbol and can be considered near ideal.

An error estimate for the threshold values is obtained at block 408 using the average measured current and the expected average current. The average measured current can be compared with the expected average current. Additionally, the error estimate can also be obtained for each of the threshold levels.

Modified threshold levels are generated at block 410 using the current threshold values and the error estimate. The error estimates per level and be utilized to adapt individual levels of the modified threshold levels.

As shown above, a scaling factor (alpha) can be utilized to mitigate over correction.

Figure 5:
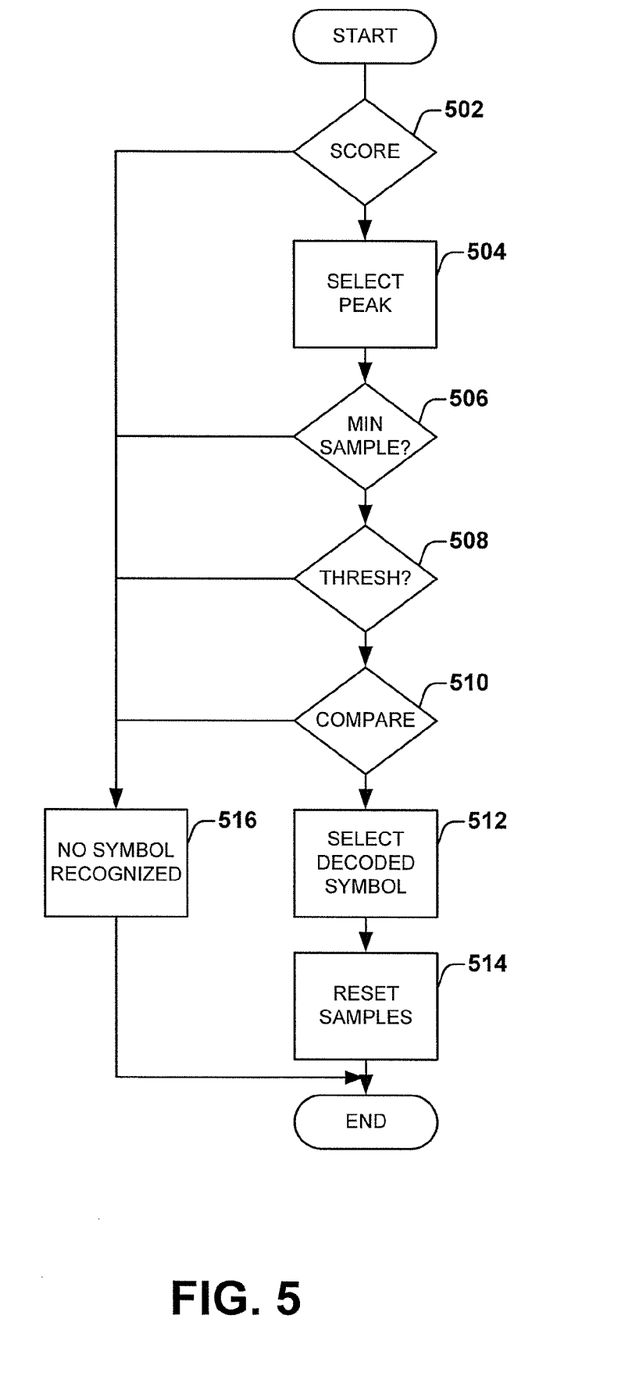
FIG. 5 is a flow diagram illustrating a method of decoding symbols using a peak correlation score.

FIG. 5 is a flow diagram illustrating a method 500 of decoding symbols using a peak correlation score. The method can utilize equations (21) to (23) to calculate a peak correlation score and recognize or identify symbols from a set of quantized samples.

An overall correlation score is generated for a reference symbol using a set of consecutive quantized samples at block 502. The set of samples are selected to be divisible by the number of chips per symbol and includes, for example, the last N samples. The overall correlation score can be re-generated for each new sample, but sill based on the last N samples.

The overall correlation score is compared with a previous correlation score for a previous reference symbol. The reference having the highest peak is selected as a peak correlation score at block 504.

A check is performed as to whether a minimum number of samples have occurred since the last decoded symbol at block 506. If the number of quantized samples is greater than the minimum number, then the method 500 moves to block 508. Otherwise, the method 500 moves to block 516.

A check is performed as to whether the peak correlation score has a lower score than a threshold score at block 508. If it does, the peak correlation score is ignored and the method continues at block 516. This implies that there is a weak correlation between the reference and a symbol. Otherwise, the method 500 moves to block 510.

A determination is made as to whether the peak correlation score is not the maximum score when compared against all other references at block 510. If it is not, the peak correlation score is ignored and the method 500 continues at block 516.

If the peak correlation score is also the maximum score, then the reference is chosen as the symbol or pattern recognized at block 512 for the set of samples. The set of stored samples is reset at block 514. A new pattern recognition continues with a new set of samples by starting again at block 502.

While the above methods are illustrated and described as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the disclosure herein. Also, one or more of the acts depicted herein may be carried out in one or more separate acts and/or phases.

It is appreciated that the claimed subject matter may be implemented as a method, apparatus, or article of manufacture using standard programming and/or engineering techniques to produce software, firmware, hardware, or any combination thereof to control a computer to implement the disclosed subject matter (e.g., the systems shown above are non-limiting examples of system that may be used to implement the disclosed methods). The term "article of manufacture" as used herein is intended to encompass a computer program accessible from any computer-readable device, carrier, or media. Of course, those skilled in the art will recognize many modifications may be made to this configuration without departing from the scope or spirit of the claimed subject matter.

A threshold estimate system includes a level quantizer, a correlation mechanism, and a threshold adaptation component. The level quantizer is configured to receive an input signal and to generate a quantization signal from the input signal according to one or more threshold levels. The correlation mechanism is configured to correlate the quantization signal with reference symbols to generate an output signal. The threshold adaptation component is configured to modify the one or more threshold levels according to the output signal and the input signal.

A method for updating threshold levels used for quantization is disclosed. Current threshold values for a symbol are obtained. An average measured current is generated for the symbol from a modulated current signal. An expected average current is generated for the symbol according to the current threshold values. An error estimate is obtained according to the average measured current and the expected average current.

A method of recognizing symbols in a quantization signal is disclosed. A set of consecutive quantization samples is obtained beginning with a last sample. The number of samples correspond to a symbol or symbol size. A correlation score is generated for the set of samples. The correlation score is compared with at least one previous correlation score to identify a peak correlation score. On identifying the peak correlation score, a symbol is assigned to the set of samples. The symbol can be provided in an output signal.

In particular regard to the various functions performed by the above described components or structures (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "including", "includes", "having", "has", "with", or variants thereof are used in either the detailed description and the claims, such terms are intended to be inclusive in a manner similar to the term "comprising".

What is claimed is:

1. A threshold estimation system comprising:
   a level quantizer configured to receive an input signal and generate a quantization signal according to one or more threshold levels;
   a correlation mechanism configured to recognize symbols from the quantization signal and generate a data stream based thereon, to compare the recognized symbols with reference symbols and generate a correlation score based thereon, and to generate an output signal having the data stream and the correlation score; and
   a threshold adaptation component configured to modify the one or more threshold levels according to the output signal and the input signal.

2. The system of claim 1, wherein the one or more threshold levels includes at least 2 threshold levels.

3. The system of claim 1, wherein the input signal is a differential signal using current modulation at a first modulated current level and a second modulated current level.

4. The system of claim 3, wherein the second modulated current level is twice the first modulated current level.

5. The system of claim 1, further comprising a quiescent current removal component configured to remove a quiescent current from the input signal prior to being received by the level quantizer.

6. The system of claim 1, wherein the input signal includes amounts of information as chips.

7. The system of claim 6, wherein the chips have a specified chip duration.

8. The system of claim 6, wherein a portion of the chips correspond to a symbol.

9. The system of claim 1, wherein the threshold adaptation component is configured to obtain an average measured current and determine an expected average current for a symbol from the output signal.

10. The system of claim 9, wherein the threshold adaptation component is configured to obtain an error estimate according to the average measured current and the expected average current and to modify the one or more threshold levels according to the error estimate.

11. The system of claim 1, wherein the correlation mechanism is configured to generate a correlation score from quantization samples of the quantization signal and to decode symbols according to the correlation score.

12. The system of claim 1, wherein the correlation mechanism is configured to utilize reference values and boundary crossings to generate the correlation score.

13. A method for updated threshold levels used for quantization, the method comprising:
   detecting and recognizing a symbol by a correlation mechanism;
   obtaining a plurality of current samples for the recognized symbol;
   obtaining current threshold values for the recognized symbol;
   generating an average measured current for the recognized symbol according to the obtained plurality of current samples;
   generating an expected average current for the recognized symbol according to the current threshold values; and
   obtaining an error estimate for the recognized symbol according to the average measured current and the expected average current.

14. The method of claim 13, further comprising generating updated threshold values for the recognized symbol according to the error estimate.

15. The method of claim 13, wherein the current threshold values are initial values.

16. The method of claim 13, wherein obtaining samples of a modulated current signal to generate the average measured current.

17. The method of claim 13, further comprising scaling the error estimate by a factor to mitigate overcorrection.

18. A method of recognizing symbols in a quantization signal, the method comprising:
   obtaining a set of samples beginning with a last sample;
   identifying transition samples from the obtained set of samples that are adjacent to boundary crossings;
   generating a correlation score for the set of samples, wherein the identified transition samples are set to a score of zero; and
   comparing the correlation score with at least one previous correlation score to identify a peak correlation score.

19. The method of claim 18, further comprising selecting a symbol on identifying the peak correlation score by correlating the peak correlation score with reference values.

20. The method of claim 18, further comprising obtaining another set of samples beginning with a next sample.

21. The method of claim 18, wherein obtaining the set of samples includes obtaining threes samples per chip from a quantization signal.

* * * * *